United States Patent
Cho et al.

(10) Patent No.: US 7,692,188 B2
(45) Date of Patent: Apr. 6, 2010

(54) DISPLAY DEVICE AND MANUFACTURING METHOD THEREOF

(75) Inventors: Seung-hwan Cho, Hwaseong-si (KR); Yong-uk Lee, Seongnam-si (KR); Min-ho Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 11/739,804

(22) Filed: Apr. 25, 2007

(65) Prior Publication Data
US 2007/0254429 A1 Nov. 1, 2007

(30) Foreign Application Priority Data
Apr. 28, 2006 (KR) .................. 10-2006-0038915

(51) Int. Cl.
*H01L 51/00* (2006.01)
(52) U.S. Cl. .............. 257/40; 257/E51.006; 257/401; 438/99; 438/158
(58) Field of Classification Search .............. 257/40, 257/E51.006, E27.131, E27.152, E51.007, 257/E51.002, 401; 438/99, 158
See application file for complete search history.

(56) References Cited

U.S. PATENT DOCUMENTS

| 6,593,977 B2 * | 7/2003 | Ishihara et al. ............. 349/43 |
| 2006/0214160 A1 * | 9/2006 | Furukawa et al. ............ 257/40 |

FOREIGN PATENT DOCUMENTS

| JP | 2004031801 | 1/2004 |
| JP | 2004158710 | 6/2004 |
| JP | 2005100894 | 4/2005 |

* cited by examiner

*Primary Examiner*—Julio J Maldonado
(74) *Attorney, Agent, or Firm*—Cantor Colburn LLP

(57) ABSTRACT

A display device includes an insulation substrate, a source electrode and a drain electrode disposed on the insulation substrate and distanced from each other and including a channel area interposed therebetween, a wall exposing portions of the source electrode and the drain electrode, and defining an opening area surrounding the channel area, and an organic semiconductor layer covering the channel area, and comprising a first sub layer and a second sub layer having different grain sizes.

16 Claims, 21 Drawing Sheets

DISPLAY DEVICE AND MANUFACTURING METHOD THEREOF

This application claims priority to Korean Patent Application No. 2006-0038915, filed on Apr. 28, 2006, and all the benefits accruing therefrom under 35 U.S.C. §119, the contents of which are incorporated herein by reference in its entirety.

BACKGROUND OF INVENTION

1. Field of Invention

The present invention relates to a display device and a manufacturing method thereof, and more particularly, to a display device and a manufacturing method thereof including an organic semiconductor layer.

2. Description of the Related Art

A flat display device has become popular due to its advantages of light weight, slimness, etc. The flat display device includes an LCD (liquid crystal display), an OLED (organic light emitting diode), etc. The flat display device includes a thin film transistor substrate formed with a thin film transistor.

The thin film transistor controls and drives a pixel. The thin film transistor includes a semiconductor layer formed of amorphous silicon, polysilicon, an organic semiconductor or the like. Since the organic semiconductor can be formed at relatively normal temperature and pressure conditions, the organic semiconductor can reduce cost and be applied to a plastic insulation substrate to protect the plastic insulation substrate which otherwise is prone to be damaged by heat. Thus, a thin film transistor formed of the organic semiconductor has been under development as a driving element for a display device.

The organic semiconductor is relatively simply formed by an ink jetting method which does not need additional processes, such as a spin coating process, an exposing process, a developing process, etc. However, an organic semiconductor formed by the ink jetting process has a small grain size because of being insufficiently crystallized. If the grain size thereof is small, impurities such as water, etc. are trapped at a grain boundary and hinder a hole injection. Thus, an on/off property and mobility of a thin film transistor are deteriorated.

BRIEF SUMMARY OF THE INVENTION

An exemplary embodiment provides a display device and a manufacturing method thereof enhancing efficiency of a thin film transistor.

In a exemplary embodiment a display device includes an insulation substrate, a source electrode and a drain electrode disposed on the insulation substrate, distanced from each other and interposing a channel area between the source electrode and the drain electrode, a wall exposing portions of the source electrode and the drain electrode and defining an opening area surrounding the channel area, and an organic semiconductor layer covering the channel area. The organic semiconductor layer includes a first sub layer and a second sub layer having different grain sizes.

In an exemplary embodiment, the second sub layer is disposed on the first sub layer, and the grain size of the second sub layer is larger than that of the first sub layer.

In an exemplary embodiment, the first sub layer is disposed on a portion of the opening area, and the second sub layer is disposed on in an entire of the opening area.

In an exemplary embodiment, the opening area includes a recess.

In an exemplary embodiment, a portion of the first sub layer is disposed in the recess.

In an exemplary embodiment, the opening area includes a protruding area extending outwardly towards the wall, and a portion of the recess is formed on the protruding area.

In an exemplary embodiment, the source electrode surrounds the drain electrode, and the channel area has a C-shape.

In an exemplary embodiment, a portion of the recess surrounds the source electrode.

In an exemplary embodiment, the drain electrode includes a closed loop part, and a portion of the recess is formed inside the closed loop part.

In an exemplary embodiment, the display device further includes a metal layer positioned under the source electrode and the drain electrode. The metal layer is formed not to overlap with the recess.

In an exemplary embodiment, the display device further includes an insulation layer covering the metal layer and is positioned under the source electrode and the drain electrode. The recess is disposed on the insulation layer.

In an exemplary embodiment, the source electrode and the drain electrode include ITO (indium tin oxide) or IZO (indium zinc oxide).

An exemplary embodiment provides a display device including an insulation substrate, an insulation layer disposed on the insulation substrate, the insulation layer including a recess, a source electrode and a drain electrode disposed on the insulation substrate, positioned adjacently to the recess and distanced from each other including a channel area interposed therebetween, an organic layer whereby a portion of the organic layer is disposed in the recess, and an organic semiconductor layer disposed on the organic layer and covering the channel area.

In an exemplary embodiment, the organic layer includes an organic semiconductor material.

In an exemplary embodiment, a grain size of the organic semiconductor layer is larger than that of the organic layer.

In an exemplary embodiment, the display device further includes a metal layer positioned under the insulation layer. The metal layer overlaps the source electrode, the drain electrode and the channel area.

An exemplary embodiment provides a manufacturing method of a display device. The method includes forming a source electrode and a drain electrode at a predetermined distance from each other and interposing a channel area therebetween on an insulation substrate, forming a wall exposing portions of the source electrode and the drain electrode and defining an opening area including the channel area, forming a first organic semiconductor layer on a portion of the opening area and forming a second organic semiconductor layer covering an entire of the first organic semiconductor layer and the channel area.

In an exemplary embodiment, the opening area includes a recess, and a portion of the first organic semiconductor layer is formed in the recess.

In an exemplary embodiment, the forming a first organic semiconductor layer forming stage includes providing a first ink including a first organic semiconductor material and a first solvent, jetting the first ink to the opening area, and drying the first ink to remove the first solvent.

In an exemplary embodiment, the forming a second organic semiconductor layer includes providing a second ink including a second organic semiconductor material and a second solvent, jetting the second ink to the opening area, and drying the second ink to remove the second solvent.

In an exemplary embodiment, the first ink and the second ink include the same materials.

In an exemplary embodiment, the first solvent and the second solvent have different polarities.

In an exemplary embodiment, a volume of the first ink to be jetted is 15% to 30% of a volume of the second ink to be jetted.

In an exemplary embodiment, the manufacturing method of the display device further includes forming a metal layer on the insulation substrate before the forming a source electrode and drain electrode. The metal layer is formed not to overlap with the recess.

BRIEF DESCRIPTION OF THE DRAWINGS

The above and/or other aspects and advantages of the prevent invention will become apparent and more readily appreciated from the following description of the exemplary embodiments, taken in conjunction with the accompany drawings, in which.

DETAILED DESCRIPTION OF THE INVENTION

Figure 1:
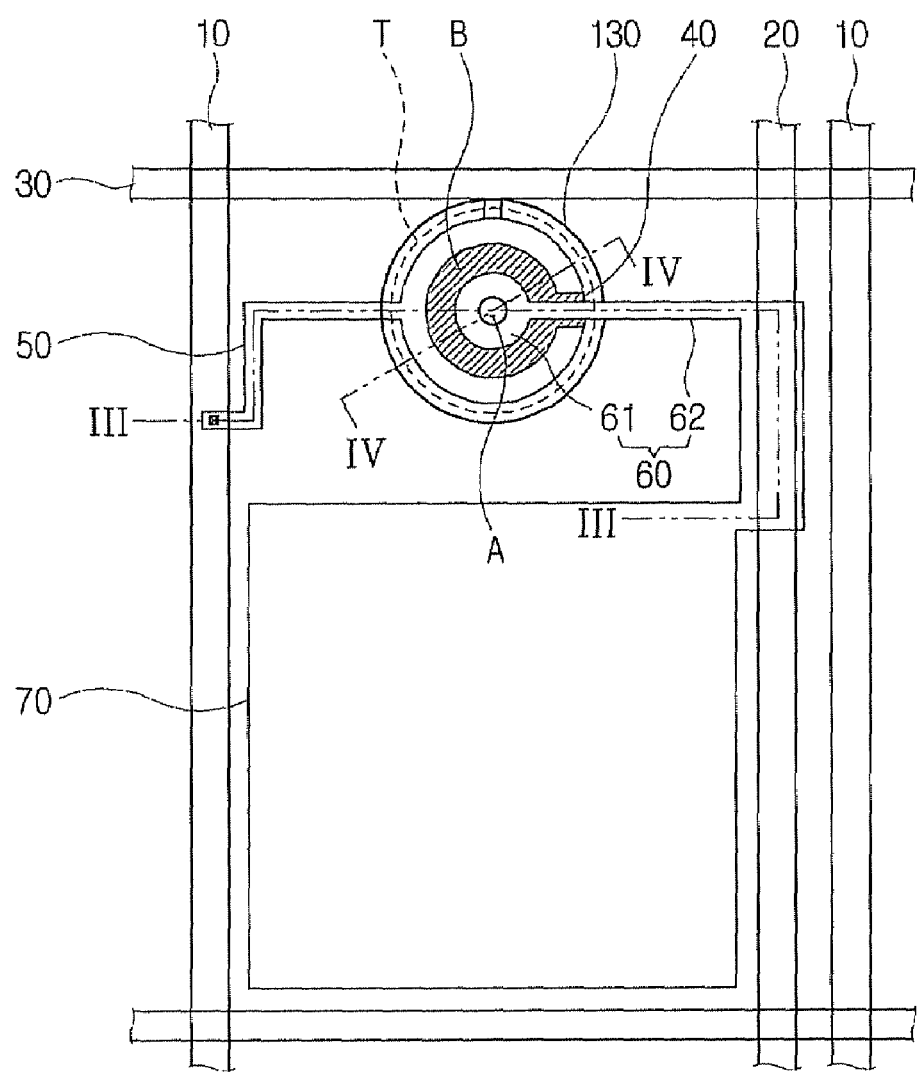
FIG. 1 is a circuit diagram of an exemplary embodiment of a display device according to the present invention.

Reference will now be made in detail to the embodiments of the present invention, examples of which are illustrated in the accompanying drawings, wherein like reference numerals refer to like elements throughout. The embodiments are described below so as to explain the present invention by referring to the figures.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "upper" or "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

In the illustrated embodiments, a thin film transistor substrate can be applied to an LCD (liquid crystal display), an OLED (organic light emitting diode), or other display devices.

As shown in FIGS. 1 to 4, an insulation substrate 100 of a display device may be formed of glass or plastics. If the insulation substrate 100 is formed of plastics, a display device can have flexibility. Since an organic semiconductor layer 80 can be formed at relatively normal temperature and pressure conditions, the insulation substrate 100 can be advantageously and relatively simply formed of plastics. In exemplary embodiments, the insulation substrate 100 may be formed of poly carbon, polyimide, PES (poly ethersulfone), PAR (poly acrylate), PEN (poly ethylene naphthalate), PET (poly ethylene terephthalate), etc.

A first metal line layer 10 and 20 is disposed on the insulation substrate. The first metal line layer 10 and 20 includes a data line 10 extended in a direction (e.g., a longitudinal direction) and a storage electrode line 20 formed substantially in parallel with the data line 10. A pixel electrode 70 is interposed between the data line 10 and the storage electrode line 20.

The first metal line layer 10 and 20 may include a data pad (not shown) provided at an end part of the data line 10 and receiving a driving signal and/or a control signal from an outside.

In exemplary embodiments, the first metal line layer 10 and 20 may include at least one of Al, Cr, Mo, Nd, Au, Pt and Pd, or alloy thereof. The first metal line layer 10 and 20 may include a single layer or multiple layers.

The storage electrode line 20 is considered to parallel the data line 10. The storage electrode line 20 may be substantially simultaneously formed with the data line 10 and/or of the same material as the data line 10. The storage electrode line 20 forms a storage capacitor together with a first insulation layer 110, a second insulation layer 120 and a drain electrode 60.

The first insulation layer 110 is disposed on the first metal line layer 10 and 20. The first insulation layer 110 insulates the first metal line layer 10 and 20 from a second metal line layer 30 and 40. In exemplary embodiments, the first insulation layer 110 may be formed of an inorganic material such as SiNx, SiOx, etc.

The first insulation layer 110 includes a contact hole 51 exposing the data line 10. The second insulation layer 120 is removed from the contact hole 51. The first insulation layer 110 reduces or effectively prevents damage of the organic semiconductor layer 80 from remained chemical material and/or plasma penetrating through the contact hole 51 when the first metal layer 10 and 20 is formed during manufacturing processes.

The second metal line layer 30 and 40 is disposed on the first insulation layer 110. The second metal line layer 30 and 40 includes a gate line 30 crossing the data line 10 to define a pixel area, and a gate electrode 40 branching from the gate line 30. In an exemplary embodiment, the gate electrode 40 may be formed in a donut (e.g., circular, disc or rounded) shape to have a hollow central part 'A' and covers a channel area B. The gate electrode 40 reduces or effectively prevents transmission of light from a lower part of the display device through the channel area 'B' and maintain properties of the organic semiconductor layer 80. When the display device is provided as an LCD, the light from the lower part of the display device may be generated by a backlight unit (not shown).

In exemplary embodiments, the second metal line layer 30 and 40 may include a single metal layer or multiple metal layers. The multiple metal layers may include Cu, Mo, Ta, Cr, Ti, Al or Al alloy. A thickness 'd1' (e.g., perpendicular to the insulation substrate 100) of the gate electrode 40 may be 1500 Å to 3000 Å.

The second insulation layer 120 is disposed on the second metal line layer 30 and 40. In an exemplary embodiment, the second insulation layer 120 may be formed of silicon nitride, etc. The second insulation layer 120 includes recesses 52 and 53 based on positioning of the gate electrode 40.t As in the illustrated embodiment, the recesses 52 and 53 are formed by a portion of the second insulation layer 120 under which the gate electrode 40 is not positioned such that the height (e.g., in a direction perpendicular to the insulation substrate 100 and from an upper surface of the insulation substrate 100) to an upper surface of the second insulation layer 120 is smaller than other portions of the second insulation layer 120 where the gate electrode 40 is formed. A thickness 'd2' of the second insulation layer 120 may be 1500 Å to 3000 Å.

The second insulation layer 120 reduces or effectively prevents infiltration of impurities into the organic semiconductor layer 80 which is prone to damage by chemicals and plasma during manufacturing processes. In exemplary embodiments, the second insulation layer 120 is stable in a semiconductor manufacturing process and formed of a material with a relatively good light transmission.

A transparent conductive layer 50, 60 and 70 is disposed on the second insulation layer 120. In exemplary embodiments, the transparent conductive layer 50, 60 and/or 70 may be formed of ITO (indium tin oxide), IZO (indium zinc oxide), etc. The transparent conductive layer 50, 60 and 70 includes a source electrode 50 connected with the data line 10 through the contact hole 51, the drain electrode 60 at a distance from the source electrode 50 with the channel area 'B' interposed therebetween, and a pixel electrode 70 integrally formed with the drain electrode 60. As used herein, "integrally" is used to indicate an element formed to be a single unit or piece rather than combining separate elements to form the element.

The drain electrode 60 includes a first part 61 formed in a donut shape to have the central part 'A', and a second part 62 connecting the first part 61 with the pixel electrode 70. A portion of the second part 62 overlaps the storage electrode line 20 to form a storage capacitor 'C'.

The gate electrode 40 is formed to correspond to the source electrode 50, the drain electrode 60 and the channel area B. Advantageously, the gate electrode 40 can reduce or effectively prevent light directly transmitting from a lower part of the display device via the channel area 'B'. As used herein, "corresponding" is considered as corresponding substantially in shape, dimension (e.g., size) and/or positional placement relative to another element or elements.

Figure 2:
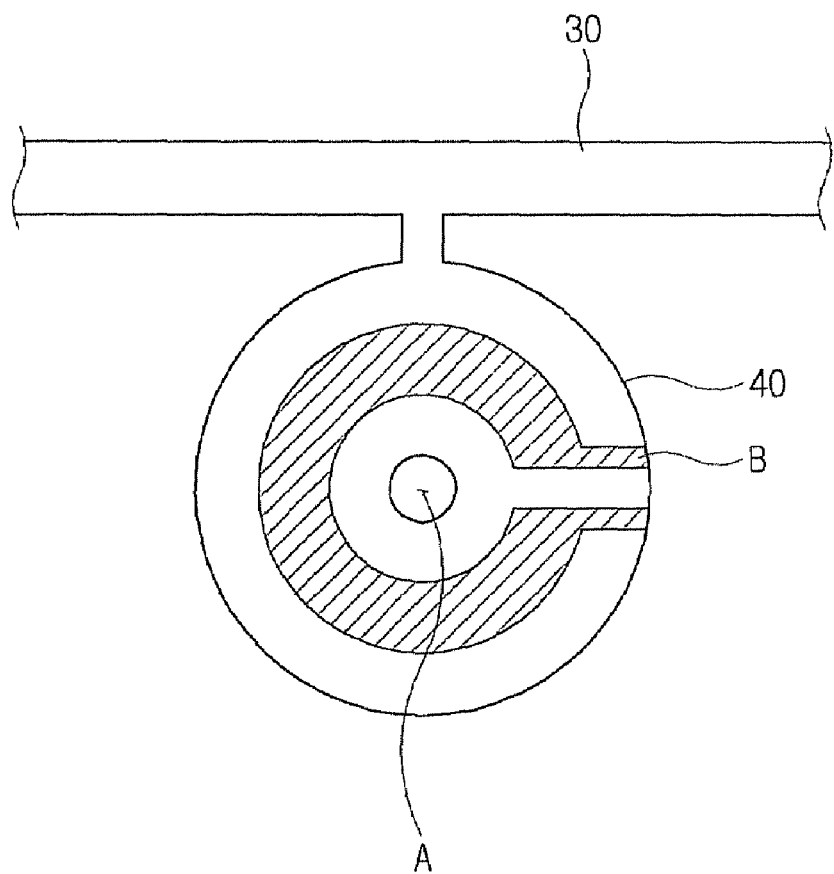
FIG. 2 illustrates an exemplary embodiment of a gate electrode of the display device according to the present invention.

The source electrode 50 surrounds the first part 61 of the drain electrode 60, so that the channel area 'B' is formed in a C-shape, such as when viewed on a plane as in FIGS. 1 and 2.

A wall 130 is disposed on portions of the second insulation layer 120 and of the transparent conductive layer 50, 60 and 70. A portion of the wall 130 is removed to form an opening area 131 surrounding the channel area 'B'. The opening area 131 exposes parts of the source electrode 50 and the drain electrode 60, and is formed wider than the gate electrode 40. As in the illustrated embodiment, the recess 52 and 53 of the second insulation layer 120 having the relatively small height at a location where the gate electrode 40 is not positioned can be formed within the opening area 131. The recess 52 and 53 includes a first recessing part 52 formed around a circumference of the source electrode 50, and a second recessing part 53 surrounded by the first part 61 of the drain electrode 60.

The wall 130 is used as a frame for forming the organic semiconductor layer 80 during fabrication processes. In one exemplary embodiment including an ink jetting process, organic semiconductor inks may have varying dropped sizes or incorrect dropped positions such that the organic semiconductor layer 80 is irregularly formed. In the illustrated embodiment, the wall 130 reduces or effectively prevents non-uniform formation of the organic semiconductor layer 80. Advantageously, positions to which organic semiconductor inks are dropped during fabrication processes are predetermined, and accordingly, the ink jetting process can be substantially exactly or accurately completed.

The wall 130 may be formed of a fluoric high molecular substance. In one exemplary embodiment when ink to be dropped to the wall 130 is hydrophilic, the wall 130 is preferably formed of a hydrophobic material. Alternatively, when ink to be dropped is hydrophobic, the wall 130 is preferably formed of a hydrophilic material.

A fluoric high molecular substance has both water repellency and oil repellency. In exemplary embodiments, the fluoric high molecular substance may include, but is not limited to, PTFE (poly tetra fluoro ethylene), FEP (fluorinated ethylene propylene), PFA (poly fluoro alkoxy), ETFE (ethylene tetra fluoro ethylene), PVDF (polyvinylidene fluoride), etc.

The organic semiconductor layer 80 is disposed within the wall 130. The organic semiconductor layer 80 covers the channel area 'B', and the source electrode 50 and the drain electrode 60 exposed through the opening area 131. In one exemplary embodiment, the organic semiconductor layer 80 is formed using an ink jetting process. A high molecular organic semiconductor substance, a low molecular organic semiconductor substance dissolvent in water or an organic solvent may be used therefore the organic semiconductor layer 80. A high molecular organic semiconductor substance is relatively easily dissolved in a solvent such that it is suitable to the ink jetting process. Alternatively, a low molecular organic semiconductor substance may be used for the organic semiconductor layer 80 as long as it is suitable for the purpose described herein and relatively easily dissolved in an organic solvent.

In exemplary embodiments, the organic semiconductor layer 80 may include, but is not limited to, derivatives including tetracene substituent or pentacene substituent, or oligothiopene connected with four to eight thiopenes through 2 and 5 positions of thiopene ring.

In exemplary embodiments, the organic semiconductor layer 80 may include, but is not limited to, PTCDA (perylenetetracarboxilic dianhidride) or imide derivatives thereof, or NTCDA (naphthalenetetracarboxilic dianhydride) or imide derivatives thereof.

In exemplary embodiment, the organic semiconductor layer 80 may include, but is not limited to, metallized pthalocyanine or halide derivatives thereof, perylene or corolene or derivatives including substituents thereof. Metal such as Cu, Co, Zn, etc. may be added to the metallized pthalocyanine.

In exemplary embodiments, the organic semiconductor layer 80 may include, but is not limited to, co-oligomer or co-polymer of thienylene and vinylene.

In exemplary embodiments, the organic semiconductor layer 80 may include, but is not limited to, thienylene or corolene or derivatives including substituents thereof, or derivatives of aromatic or heteroaromatic ring of the derivatives including at least one hydrocarbon chain of one to thirty carbons.

Figure 3:
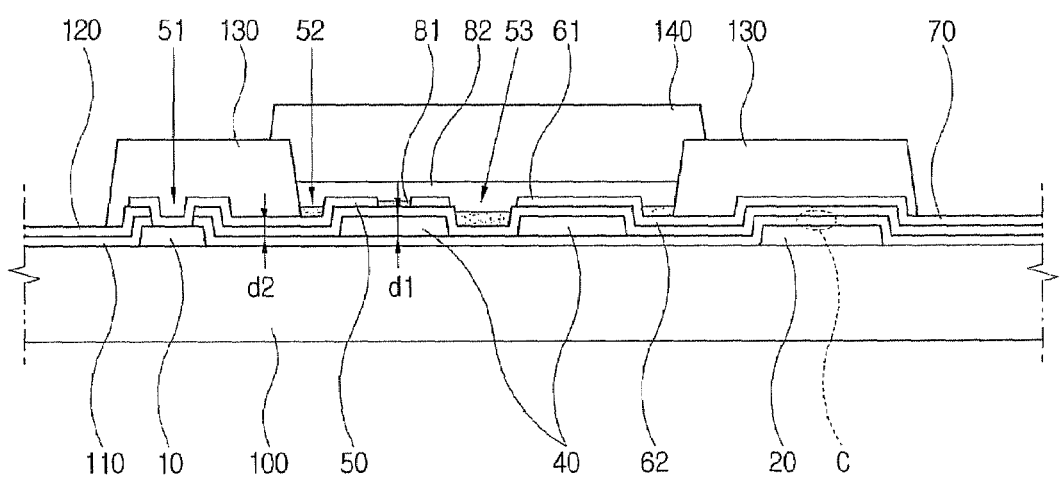
FIG. 3 is a cross-sectional view taken along line III-III in FIG. 1.
Figure 4:
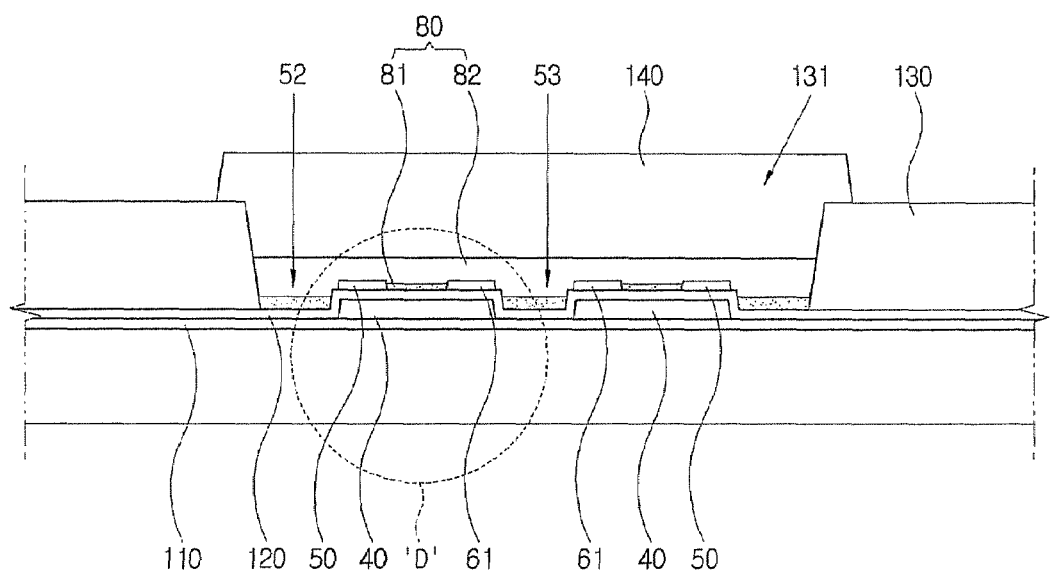
FIG. 4 is a cross-sectional view taken along line IV-IV in FIG. 1.

Referring to FIGS. 3 and 4, the organic semiconductor layer 80 includes a first sub layer 81 and a second sub layer 82 formed on the first sub layer 81. The first sub layer 81 is mainly disposed on the recess 52 and 53, and a portion of the first sub layer 81 is disposed on the channel area 'B'. The first sub layer 81 is minimally formed on the source electrode 50 and the drain electrode 60 within the recess 52 and 53. The second sub layer 82 in an entire of the opening area 131.

In an exemplary embodiment, the first sub layer 81 and the second sub layer 82 are formed using the ink jetting method. The second sub layer 82 is formed after the first sub layer 81. The first sub layer 81 and the second sub layer 82 may be formed of the same materials or of different materials from each other. The first sub layer 81 may be formed of organic material, except organic semiconductor material.

In exemplary embodiments when the first sub layer 81 is formed of material different from that of the second sub layer 82 or non-organic semiconductor material, the first sub layer 81 is preferably formed of material having a structure similar to that of the second sub layer 82. In one exemplary embodiment, the first sub layer 81 and the second sub layer 82 have the same carbon skeletons, but they have different functional groups connected to the carbon skeletons.

A third insulation layer 140 is disposed on the organic semiconductor layer 80. The third insulation layer 140 reduces or effectively prevents deterioration of the organic semiconductor layer 80 and maintains properties of the semiconductor layer 80. In an exemplary embodiment, the third insulation layer 140 may be formed using the ink jetting method. An additional insulation layer (not shown) or a passivation layer (not shown), such as including other inorganic materials may be provided on the third insulation layer 140.

Hereinafter, a function of the sub layers 81 and 82 of the organic semiconductor layer 80 will be described by referring to FIG. 5.

Figure 5:
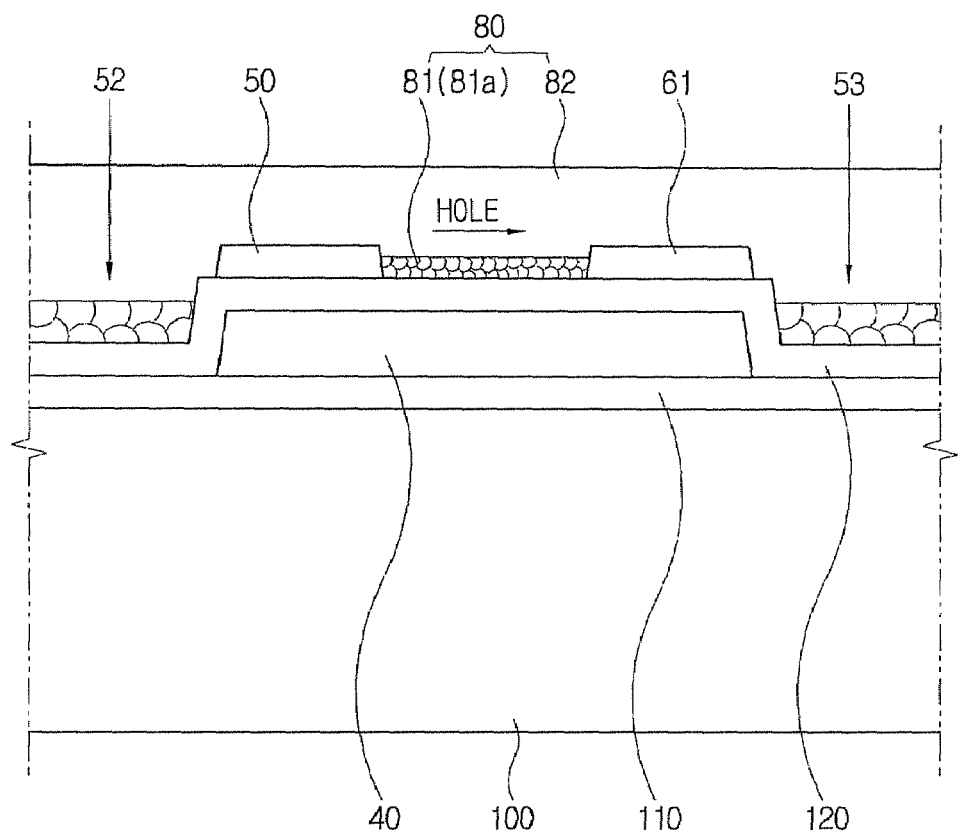
FIG. 5 is an enlarged view illustrating portion 'D' in FIG. 4.

As shown in FIG. 5, when a gate on voltage is supplied to the gate electrode 40, a thin film transistor 'T' (refer to FIG. 1) is turned on, and a hole 'HOLE', moves in a direction from the source electrode 50 to the drain electrode 60 as indicated by the arrow in FIG. 5. A relatively small amount of the first sub layer 81 is disposed at the channel area 'B', and most of the first sub layer 81 is disposed in the recess 52 and 53. The second sub layer 82 covers the first sub layer 81 and the channel area 'B'.

A grain size of the first sub layer 81 is relatively small. A grain size of the second sub layer 82 is relatively big and essentially has a single crystal state. A grain boundary is formed among grains 81a of the first sub layer 81.

Moisture, etc. may be trapped into the grain boundary formed in the channel area 'B'. The trapped moisture deteriorates on/off property and mobility of the thin film transistor, and increases hysteresis thereof. Thus, the thin film transistor is deteriorated.

As in the illustrated embodiment, the relatively large grain size, such as in the second sub layer 82, reduces or prevents a grain boundary from being formed to the channel area 'B'. Thus, moisture can be prevented from being trapped, thereby enhancing efficiency of the thin film transistor.

As in the illustrated embodiment, the recess 52 and 53 is formed in the second insulation layer 120 based on the profile and/or dimension of the gate electrode 40, such as thickness of the gate electrode 40. Alternatively, a separate insulation layer (not shown) may be patterned to have a recess. Also, alternatively, a recess may be not formed, and the first sub layer 81 may be partially disposed in the channel area 'B' during manufacturing processes.

Hereinafter, an exemplary embodiment of a manufacturing method of the display device according to the present invention will be described by referring to FIGS. 6A to 6G.

Figure 6A:
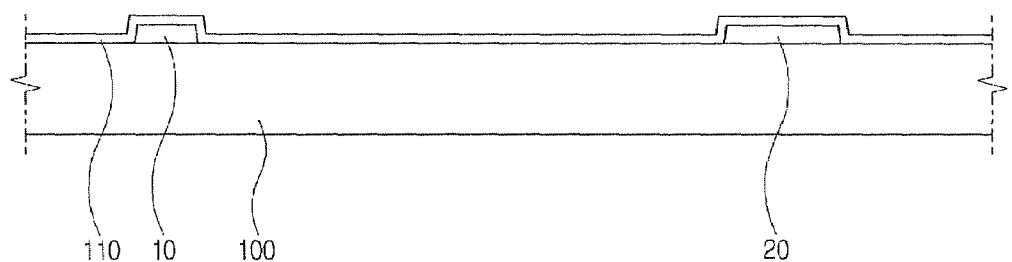
FIGS. 6A to 6G illustrate an exemplary embodiment of a manufacturing method of the display device according to the present invention.

As shown in FIG. 6A, a first metal layer is formed on the insulation substrate 100 to pattern the data line 10 and the storage electrode line 20. The first insulation layer 110 is formed, such as using a chemical vapor deposition, etc.

Figure 6B:
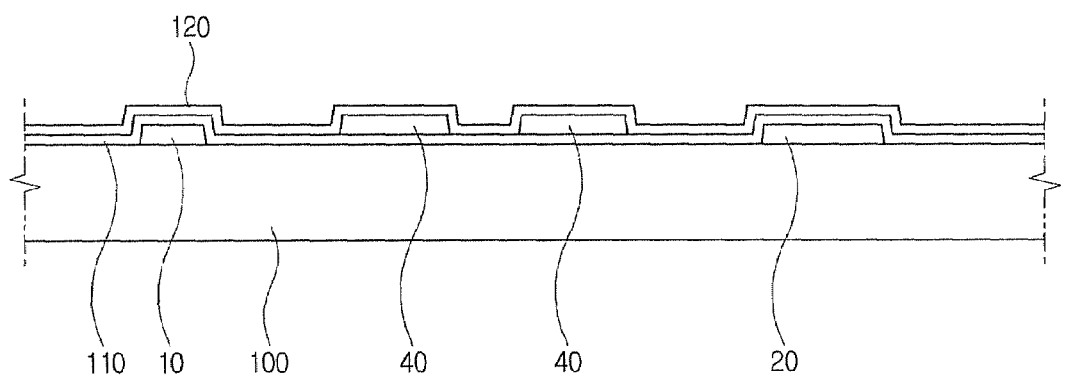

Referring to FIG. 6B, a second metal layer is formed to pattern the gate electrode 40. The gate line 30 may be substantially simultaneously formed. The gate electrode 40 will be positioned within boundaries of the source electrode 50, the drain electrode 60 and the channel area 'B' which are to be formed. The second insulation layer 120 is formed, such as using a chemical vapor deposition, etc.

Figure 6C:
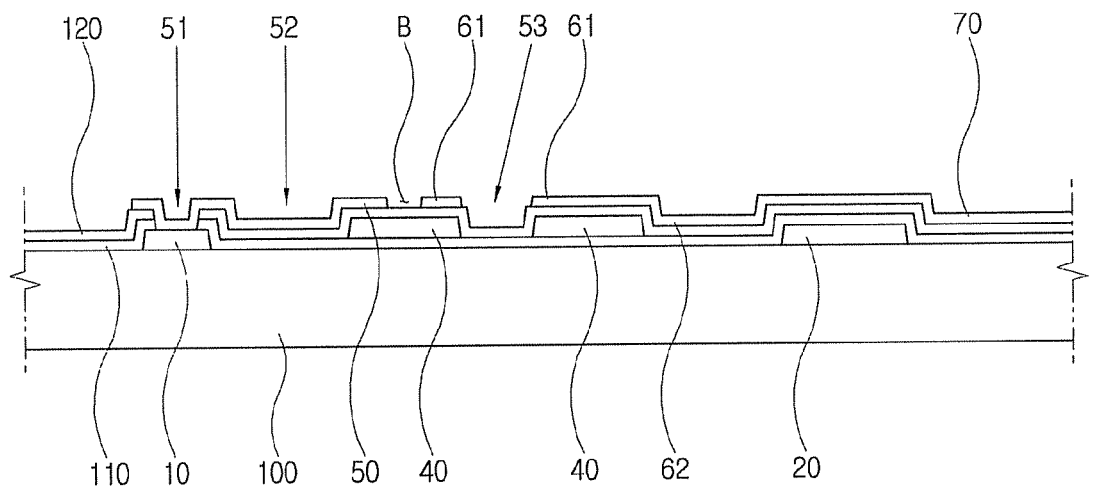

Referring to FIG. 6C, the first insulation layer 110 and the second insulation layer 120 are patterned such that the contact hole 51 is formed exposing the data line 10. A transparent conductive material layer is formed to subsequently pattern the source electrode 50, the drain electrode 60 and the pixel electrode 70.

As the source electrode 50 and the drain electrode 60 are formed, the channel area 'B' is formed to have a C-shape.

Figure 6D:
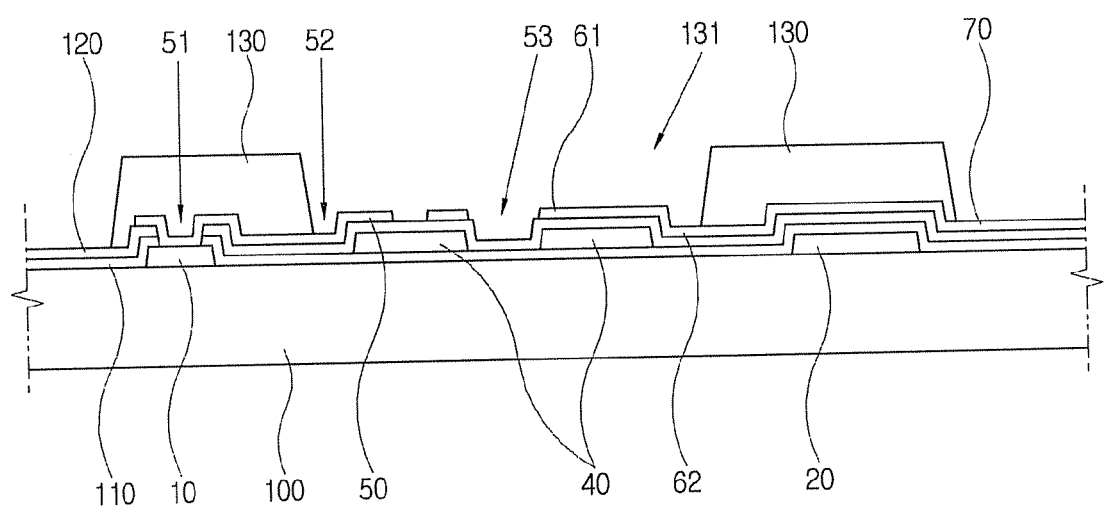

Referring to FIG. 6D, the wall 130 is formed to surround the channel area 'B'. The wall 130 defines the opening area 131 exposing parts of the source electrode 50, the drain electrode 60, and the channel area 'B'.

The opening area 131 is formed wider than the gate electrode 40 in a direction parallel to the insulation substrate 110. A part of the second insulation layer 120 under which the gate electrode 40 is not positioned has a relatively small height (e.g., from an upper surface of the first substrate 100) such that the recess 52 and 53 is formed thereto. The channel area 'B' is surrounded by the source electrode 50 and the drain electrode 60 such that the height of the channel area 'B' from the upper surface of the first substrate 100 becomes smaller than the height of the source electrode 50 and the drain electrode 60 formed around the channel area 'B'.

Figure 6E:
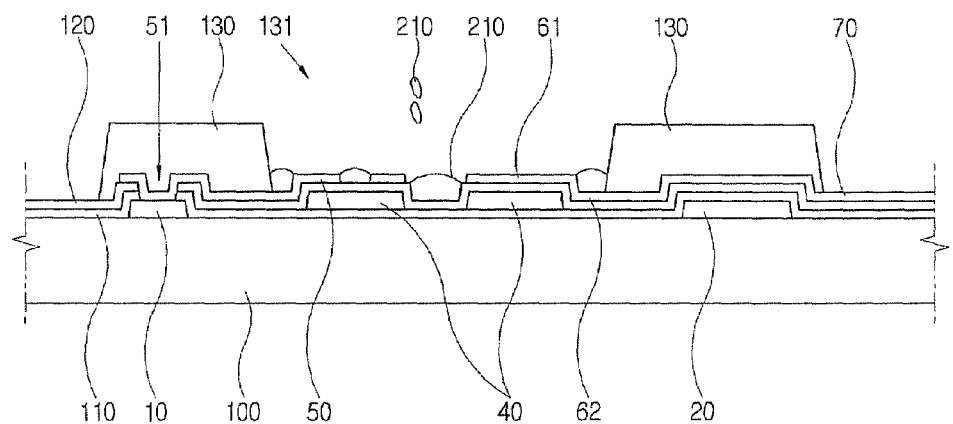

Referring to FIG. 6E, a first ink 210 is deposited or dropped to the opening area 131. In an exemplary embodiment, the first ink 210 includes a first organic semiconductor material and a first solvent and is dropped using an ink jetting method. The first ink 210 is dropped to have a relatively small amount.

A largest portion of the first ink 210 is disposed on the recess 52 and 53, and a smaller portion of the first ink 210 is disposed on the channel area 'B'. The first ink 210 is minimally disposed on the source electrode 50 and the drain electrode 60 within the recess 52 and 53 because of repulsion between the first ink 210, and the source electrode 50 and the drain electrode 60, such as including ITO or IZO.

The dropped first ink 210 is dried to remove a first solvent such that the first sub layer 81 is formed. A grain size of the first sub layer 81 is relatively small such that numerous grain boundaries are formed in the channel area 'B'.

Figure 6F:
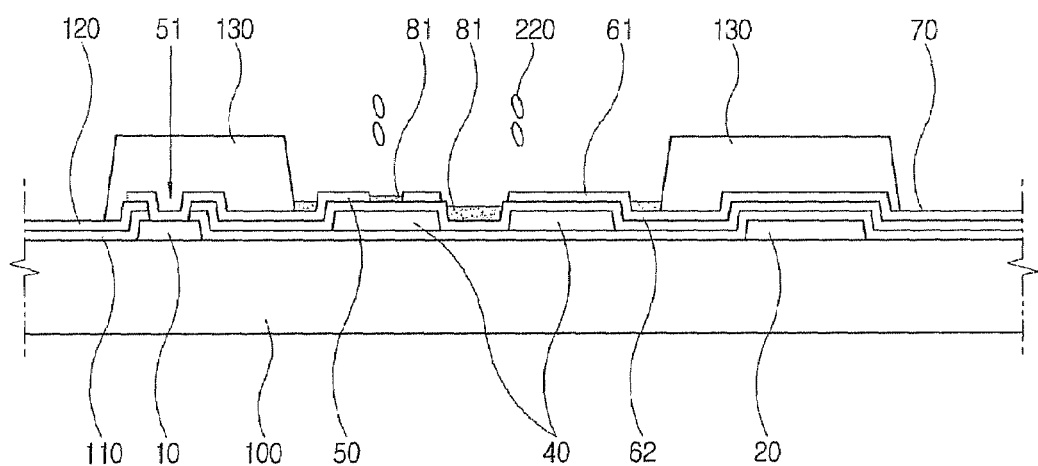

Referring to FIG. 6F, a second ink 220 is deposited or dropped to the opening area 131 having the first sub layer 81 previously formed therein. In an exemplary embodiment, the second ink 220 includes a second organic semiconductor material and a second solvent, and is dropped using an ink jetting method. The dropped amount of the second ink 210 is relatively larger than that of the first ink 220. In one exemplary embodiment, if the first ink 210 and the second ink 220 are the same materials, the dropped amount (e.g., volume) of the first ink 210 may be about 15% to about 30% of the second ink 220.

The second ink 220 is dropped covering an entire of the opening area 131. The deposited second ink 220 is dried forming the second sub layer 82. The second ink 220 is dried when the second ink 220 partially contacts the first sub layer 81.

During the drying of the second ink 220, the first sub layer 81 functions as a seed. The first sub layer 81 smoothes nucleation and growth of the dried second ink 220. The first sub layer 81 increases a nucleation site during drying of the second ink 220.

The second sub layer 82 formed from the second ink 220 has an increased degree of crystallinity, and the grain size of the second sub layer 82 becomes increased, thereby reducing a grain boundary of the second sub layer 82. Since the grain boundary minimally exists in the second sub layer 82 which has the relatively large grain size, trapped moisture and resulting deterioration of the thin film transistor can be reduced or effectively prevented. As in the illustrated embodiment, the second sub layer 82 has a substantially uniform property with the first sub layer 81, thereby reducing variance in forming the thin film transistor.

While the second sub layer 82 is formed, the first sub layer 81 may be dissolved to the second ink 220 and limiting the first sub layer 81 from functioning as a seed. In an exemplary embodiment, to prevent the first sub layer 81 from being dissolved, it is preferable that the first ink 210 is completely dried. The first sub layer 81 may be deposited in a predetermined sufficient amount such that a non-dissolving portion of the first sub layer 81 continues functioning as the seed although the first sub layer 81 is partially dissolved.

In one exemplary embodiment, the first ink 210 and the second ink 220 are the same materials, an amount of the dropped first ink 210 is more than approximately 15% an amount of the second ink 220. If the amount of the dropped first ink 210 is smaller than 15% of the second ink 220, most of the first sub layer 81 becomes dissolved and the first sub layer 81 may not sufficiently function as the seed when the second ink 220 is formed. If the amount of the dropped first ink 210 is larger than 30% of the second ink 220, the first sub layer 81 becomes excessively formed in the channel area 'B'.

In exemplary embodiments, to prevent dissolution of the first sub layer 81, the second solvent of the second ink 220 is preferably provided as a solvent into which the first sub layer 81 is difficult to be dissolved. In one exemplary embodiment, the first solvent of the first ink 210 and the second solvent of the second ink 220 may have different polarities.

Figure 6G:
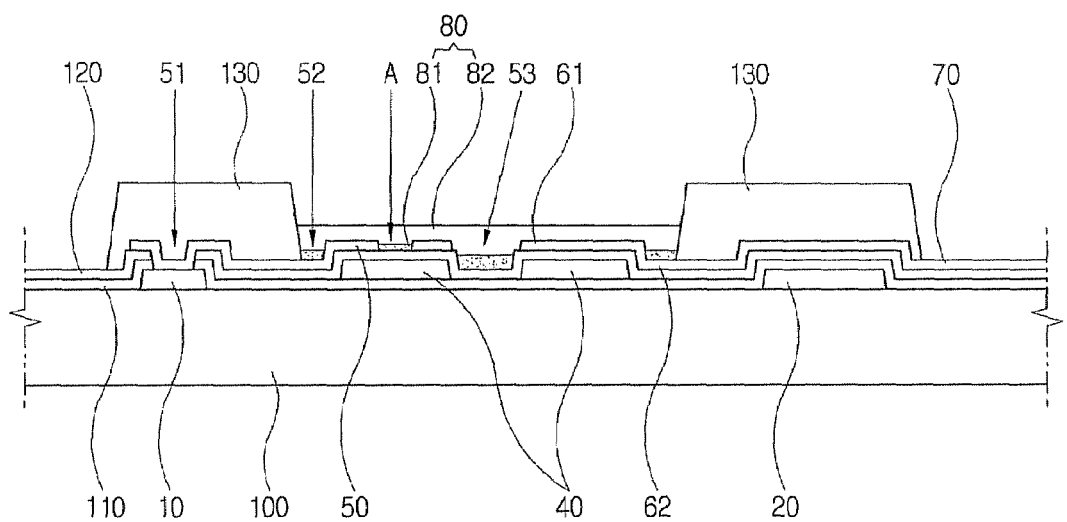

Referring to FIG. 6G, the second ink 220 is dried forming the second sub layer 82. The second sub layer 82 is formed in an entire area of the opening area 131.

The third insulation layer 140 is formed using the ink jetting method to accomplish the display device as shown in FIG. 3.

Hereinafter, another exemplary embodiment of a display device according to the present invention will be described by referring to FIGS. 7 and 8.

Figure 7:
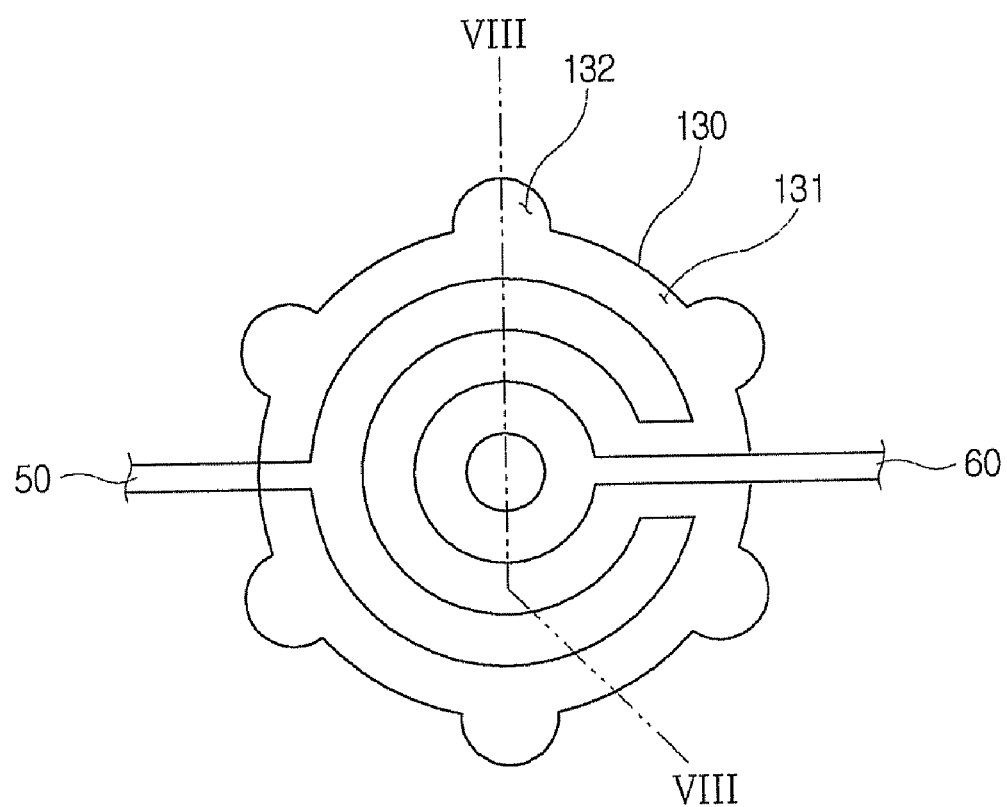
FIG. 7 illustrates an exemplary embodiment of a thin film transistor of a display device according to the present invention.
Figure 8:
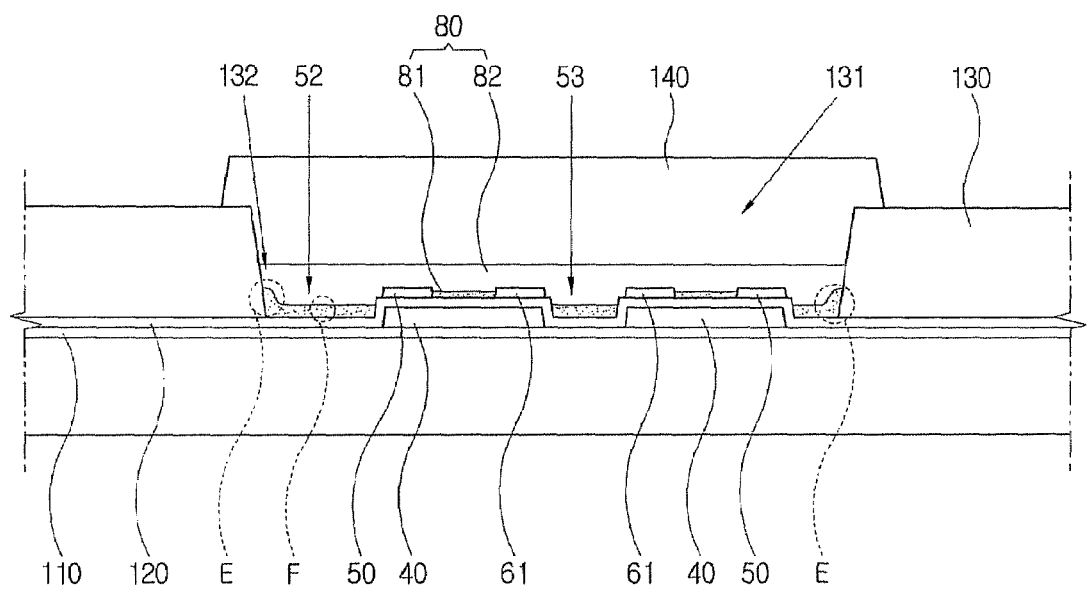
FIG. 8 is a cross-sectional view taken along line VIII-VIII in FIG. 7.

As shown in FIGS. 7 and 8, a display device includes a portion of wall 130 additionally removed to further define a protruding area 132 protruding from the opening area 131. The protruding area 132 is connected with the opening area 131. As illustrated in FIG. 7, the protruding area 132 has a semi-circular shape when viewed on a plane, such as from above the display device, but the shape and relative dimension of the protruding area 132 is not limited thereto.

The protruding area 132 extends across an area of the first recessing part 52 increasing an area in which the first sub layer 81 is formed. The protruding area 132 reduces a "coffee stain" effect and allows the first sub layer 81 to have a relatively uniform thickness. As used herein, "coffee stain" is used to referred to result when a circumference of a formed organic layer becomes thicker than a central part thereof, such as through the manufacturing process.

In exemplary embodiments of an ink jetting method, a central part of a dropped ink and a circumference thereof may be dried to have different thickness. The central part has a high solvent density and is relatively slowly dried, but the circumference has a low solvent density and is relatively quickly dried. An organic material dissolved in a solvent moves to the circumference in which the solvent is quickly dried. Thus, a circumference of a formed organic layer becomes thicker than a central part thereof, thereby creating the "coffee stain" effect.

Relating to the "coffee stain," referring to portion 'E' illustrated in FIG. 8, a first sub layer 81 has a relatively large thickness adjacent to wall 130. As the thickness of the first sub layer 81 varies, the quality of a second sub layer 82 becomes deteriorated. The protruding area 132 of the illustrated embodiment allows the first sub layer 81 to have a relatively large area having a uniform thickness, referring to portion 'F', despite the "coffee stain" effect. The first sub layer 81 having large area of uniform thickness can enhance the quality of the second sub layer 82.

Hereinafter, another exemplary embodiment of a display device according to the present invention will be described by referring to FIGS. 9 to 11.

Figure 9:
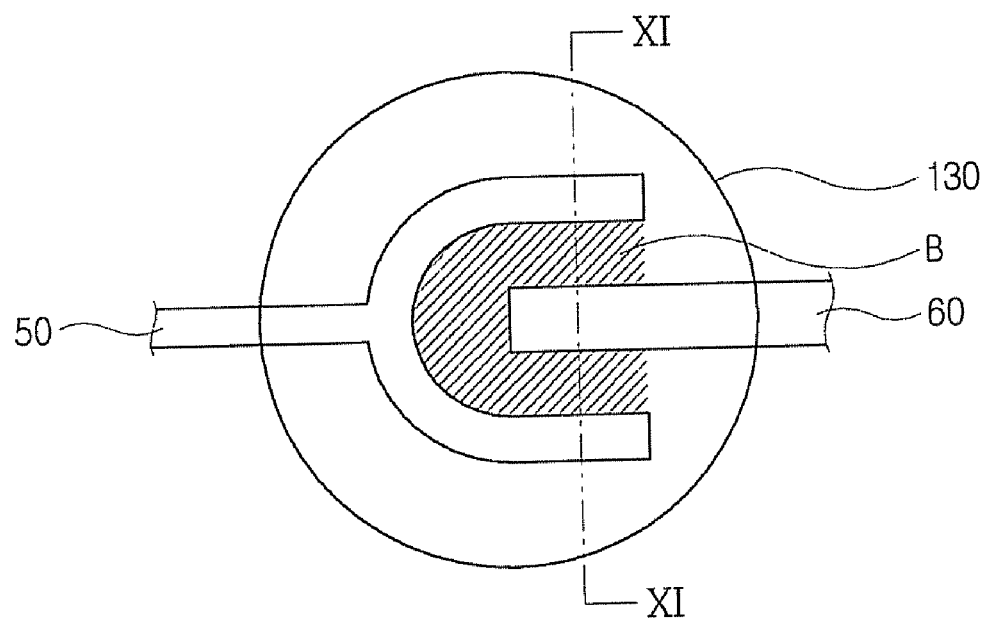
FIG. 9 illustrates another exemplary embodiment of a thin film transistor of a display device according to the present invention.
Figure 10:
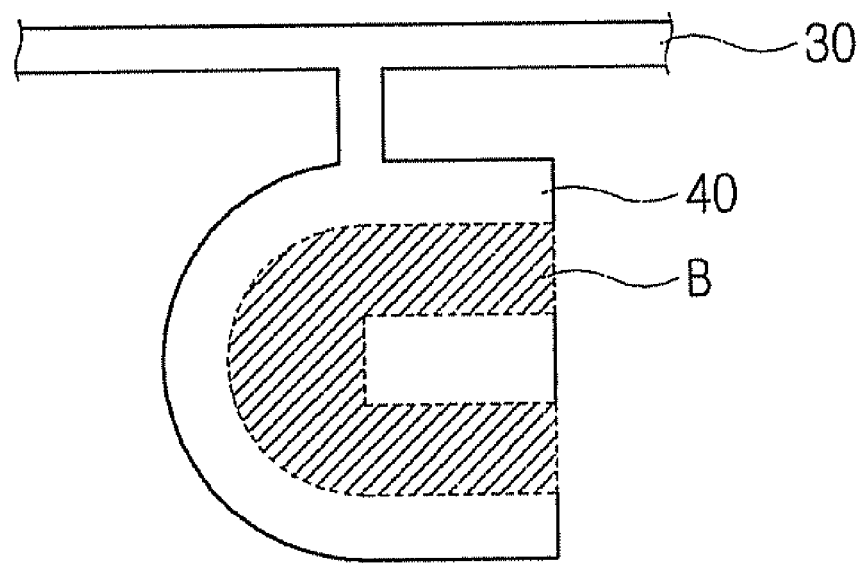
FIG. 10 illustrates another exemplary embodiment of a gate electrode of the display device according to the present invention.
Figure 11:
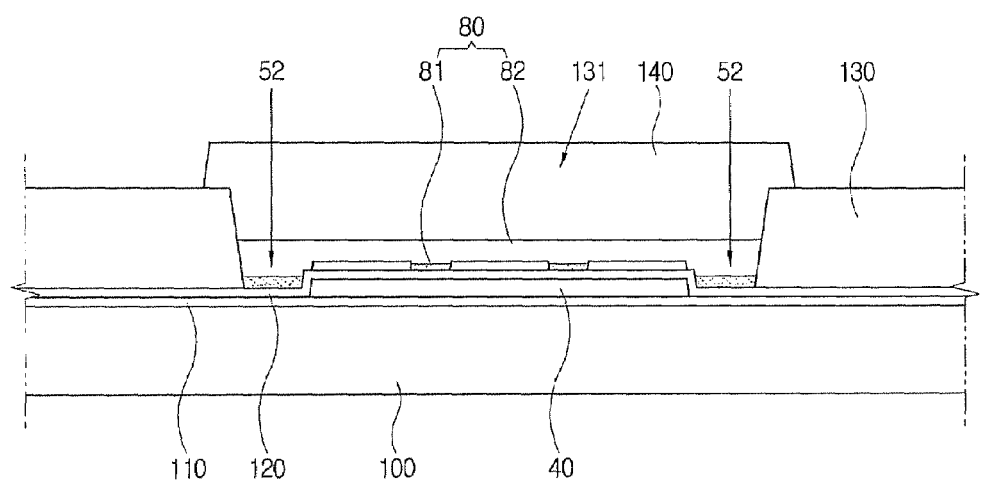
FIG. 11 is a cross-sectional view taken along line XI-XI in FIG. 9.

As shown in FIGS. 9 to 11, a display device includes a channel area 'B' having a substantially U-shape when viewed on a plane. A drain electrode 60 is formed without a closed loop part, such as is illustrated in FIGS. 1, 2 and 7. A gate electrode 40 is disposed corresponding to a source electrode 50, the drain electrode 60 and the channel area 'B'. As illustrated in FIG. 11, outer boundaries of the gate electrode 40 substantially correspond with outer boundaries of the source electrode 50, when viewed in the cross-section. A recess 52 is partially disposed around (e.g., adjacent to) a wall 130 depending on shapes and/or dimensions of the source electrode 50, the drain electrode 60 and/or the gate electrode 40.

Hereinafter, another exemplary embodiment of a display device according to the present invention will be described by referring to FIGS. 12 and 13.

Figure 12:
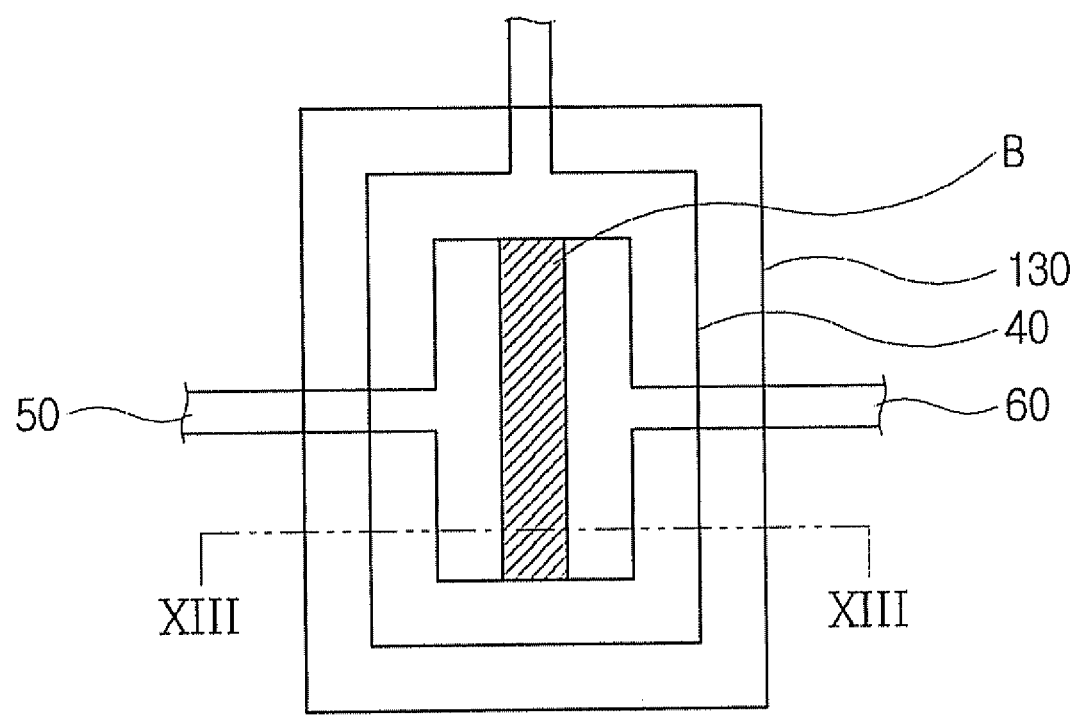
FIG. 12 illustrates another exemplary embodiment of a thin film transistor of a display device according to the present invention.
Figure 13:
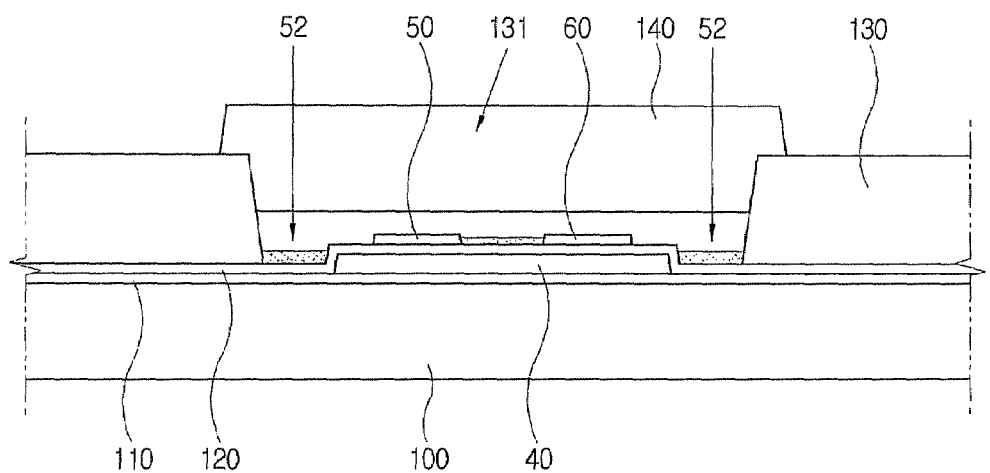
FIG. 13 is a cross-sectional view taken along line XIII-XIII in FIG. 12.

As shown in FIGS. 12 and 13, a display device includes a channel area 'B' having a substantially rectilinear shape. A drain electrode 60 is formed without a closed loop part. A gate electrode 40 is not limitedly positioned within boundaries of a source electrode 50, a drain electrode 60 and the channel area 'B', such as is illustrated in FIG. 11. As illustrated in FIG. 13, outer boundaries of the gate electrode 40 extend past outer boundaries of the source electrode 50, when viewed in the cross-section. A recess 52 is limitedly formed by the second insulating layer 120 in an area adjacent to wall 130 and is distanced from the gate electrode 40.

Hereinafter, exemplary embodiments of display devices according to the present invention will be described by referring to FIGS. 14 and 15.

Figure 14:
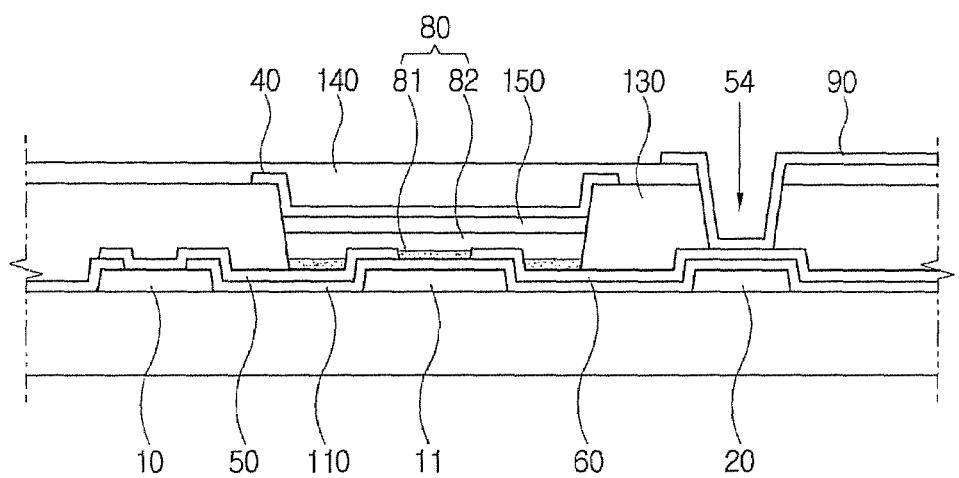
FIG. 14 is a cross-sectional view illustrating another exemplary embodiment of a display device according to the present invention.

As shown in FIG. 14, a display device includes a light intercepting layer 11 disposed under a channel area 'B'. The light intercepting layer 11 is formed of the same metal as a data line 10.

A wall 130 defines an opening area 131 bigger (e.g., wider in a direction parallel to the first insulation substrate 100) than the light intercepting layer 11. A recess 52 is formed around and adjacent to the wall 130 by contouring the first and second insulation layers 110 and 120 along the light intercepting layer 11 protruding upwards from the first substrate 100. A first sub layer 81 is disposed in the recess 52 and the channel area 'B'.

An organic insulation layer 150 is disposed on an organic semiconductor layer 80 to protect the organic semiconductor layer 80. A gate electrode 40 is disposed on the organic insulation layer 150 and a third insulation layer 140 is disposed on the gate electrode 40. If the organic semiconductor layer 80 directly contacts with the gate electrode 40 or an inorganic insulation layer is interposed therebetween, the organic semiconductor layer 80 may be deteriorated. The organic insulation layer 150 prevents the organic semiconductor layer 80 from directly contacting with the gate electrode 40 and maintains properties of the organic semiconductor layer 80. In an exemplary embodiment, the organic insulation layer 150 may be formed using an ink jetting method.

In the illustrated embodiment of FIG. 14, a portion of the wall 130 and the third insulation layer 140 are disposed under a pixel electrode 90. A contact hole 54 is formed in the wall 130 and the third insulation layer 140 and exposes the drain electrode 60. The pixel electrode 90 is connected with the drain electrode 60 through the contact hole 54.

In exemplary embodiments, the source electrode 50, the drain electrode 60 and the pixel electrode 90 may be formed of ITO or IZO. The pixel electrode 90 may not formed simultaneously with the source electrode 50 and the drain electrode 60.

The wall 130 and the third insulation layer 140 are positioned between the pixel electrode 90 and the data line 10 so that the distance therebetween increases. As the distance therebetween increases, interference and capacity forming therebetween can be reduced. Thus, the pixel electrode 90 can be formed adjacently to the data line 10 or overlapped therewith so that aperture ratio increases. In the same manner, the pixel electrode 90 can be formed adjacently to the gate line 30.

Figure 15:
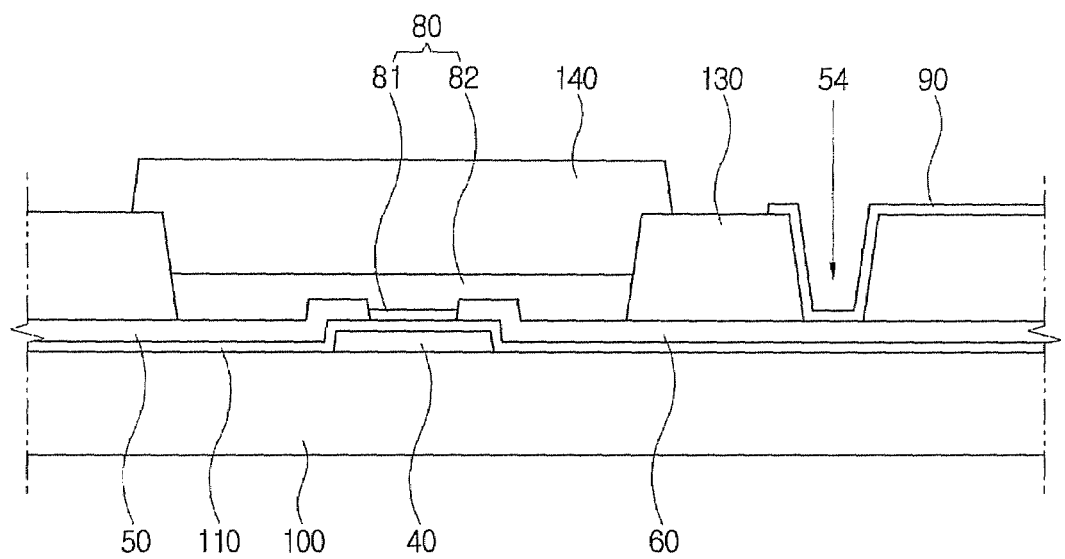
FIG. 15 is a sectional view illustrating another exemplary embodiment of a display device according to the present invention.

As shown in FIG. 15, a display device includes a source electrode 50 and a drain electrode 60 formed of metal instead of a transparent conductive material. A pixel electrode 90 is formed of a transparent conductive material, and contacts the drain electrode 60 through a contact hole 54 formed in a wall 130.

As in the illustrated embodiments, the present invention provides a display device and a manufacturing method thereof enhancing efficiency of a thin film transistor.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device, comprising:
    an insulation substrate;
    a source electrode and a drain electrode disposed on the insulation substrate, and distanced from each other and including a channel area interposed therebetween;
    a wall exposing portions of the source electrode and the drain electrode, and defining an opening area surrounding the channel area; and
    an organic semiconductor layer covering the channel area, and comprising a first sub layer and a second sub layer, the first sub layer and the second sub layer having different grain sizes
    wherein the source electrode and the drain electrode directly contact the first sub layer and the second sub layer.

2. The display device according to claim 1, wherein the second sub layer is disposed on the first sub layer, and the grain size of the second sub layer is larger than that of the first sub layer.

3. The display device according to claim 2, wherein the first sub layer is disposed in a portion of the opening area, and the second sub layer is disposed in an entire portion of the opening area.

4. The display device according to claim 1, wherein the opening area comprises a recess.

5. The display device according to claim 4, wherein a portion of the first sub layer is disposed in the recess.

6. The display device according to claim 4, wherein the opening area comprises a protruding area extending outwardly towards the wall, and a portion of the recess is formed on the protruding area.

7. The display device according to claim 4, wherein the source electrode surrounds the drain electrode, and the channel area has a C-shape.

8. The display device according to claim 7, wherein a portion of the recess surrounds the source electrode.

9. The display device according to claim 7, wherein the drain electrode comprises a closed loop part and a portion of the recess is formed inside the closed loop part.

10. The display device according to claim 4, further comprising a metal layer positioned under the source electrode and the drain electrode,
    wherein the metal layer does not overlap with the recess.

11. The display device according to claim 10, further comprising an insulation layer covering the metal layer and positioned under the source electrode and the drain electrode,
    wherein the recess is disposed on the insulation layer.

12. The display device according to claim 4, wherein the source electrode and the drain electrode comprise ITO (indium tin oxide) or IZO (indium zinc oxide).

13. A display device, comprising:
    an insulation substrate;
    an insulation layer disposed on the insulation substrate and comprising a recess;
    a source electrode and a drain electrode disposed on the insulation substrate, positioned adjacent to the recess, and distanced from each other including a channel area interposed between the source electrode and the drain electrode;
    an organic layer, a portion of the organic layer disposed in the recess; and
    an organic semiconductor layer disposed on the organic layer covering the channel area,
    wherein the source electrode and the drain electrode directly contact the organic layer and the organic semiconductor layer having different grain sizes from each other.

14. The display device according to claim 13, wherein the organic layer comprises an organic semiconductor material.

15. The display device according to claim 14, wherein a grain size of the organic semiconductor layer is larger than a grain size of the organic layer.

16. The display device according to claim 15, further comprising a metal layer positioned under the insulation layer,
    wherein the metal layer overlaps the source electrode, the drain electrode and the channel area.

* * * * *